United States Patent [19]

Lamont, Jr.

[11] Patent Number: 5,114,556
[45] Date of Patent: May 19, 1992

[54] DEPOSITION APPARATUS AND METHOD FOR ENHANCING STEP COVERAGE AND PLANARIZATION ON SEMICONDUCTOR WAFERS

[75] Inventor: Lawrence T. Lamont, Jr., San Jose, Calif.

[73] Assignee: Machine Technology, Inc., Parsippany, N.J.

[21] Appl. No.: 457,347

[22] Filed: Dec. 27, 1989

[51] Int. Cl.⁵ .............................................. C23C 14/34
[52] U.S. Cl. ...................... 204/192.12; 204/298.06; 204/298.08; 204/298.11; 204/298.16
[58] Field of Search ................... 204/192.12, 192.15, 204/298.06, 298.08, 298.12, 298.16, 298.19, 298.14, 298.11

[56] References Cited

U.S. PATENT DOCUMENTS

| | | | |
|---|---|---|---|
| 4,595,482 | 6/1986 | Mintz | 204/298.12 X |
| 4,604,180 | 8/1986 | Hirukawa et al. | 204/298.12 X |
| 4,627,904 | 12/1986 | Mintz | 204/298.06 |
| 4,664,935 | 5/1987 | Strahl | 427/38 |
| 4,693,805 | 9/1987 | Quazi | 204/298.06 X |
| 4,717,462 | 1/1988 | Homma et al. | 204/298.06 |
| 4,756,810 | 7/1988 | Lamont, Jr. et al. | 204/192.3 |
| 4,818,359 | 4/1989 | Jones et al. | 204/298.06 |

OTHER PUBLICATIONS

"Planar Deposition of Aluminum by RF/DC Sputtering with RF Bias", J. Electro-Chemical Soc., vol. 132, No. 6, pp. 1466-1472 (1985).
"Significant Improvement in Step Coverage Using Bias Sputtered Aluminum", Vac. Sci. Technol. A, vol. 4, No. 3, pp. 457-460 (May/Jun. 1986).
Vossen et al., "Thin Film Processes", Academic Press, 1978, p. 14-19.

*Primary Examiner*—Nam Nguyen
*Attorney, Agent, or Firm*—Lerner, David, Littenberg, Krumholz & Mentlik

[57] ABSTRACT

A layer of a substance such as a metal, non-metal or metal alloy is deposited, preferably by sputtering, onto the surface of a substrate such as a semiconductor wafer. The adatoms of the deposited layer are mobilized by being bombarded with a flux of low energy neutral atoms or molecules at an oblique angle of incidence to enhance step coverage and/or planarization of the semiconductor wafer. The neutral atoms or molecules are formed within the plasma by applying a negative bias potential to a reflector electrode which will attract positive ions from the plasma. The neutral atoms or molecules elastically scatter from the surface of the electrode to bombard the adatoms being deposited during the operation of the sputter source.

31 Claims, 8 Drawing Sheets

DEPOSITION APPARATUS AND METHOD FOR ENHANCING STEP COVERAGE AND PLANARIZATION ON SEMICONDUCTOR WAFERS

BACKGROUND OF THE INVENTION

The present invention relates in general to an apparatus and method for depositing a layer of a material on a substrate surface, such as a semiconductor wafer, and more particularly, to planarizing a layer of such material and/or enhancing step coverage over severe geometrical structures on the substrate surface, e.g., contact holes, which invention is particularly useful in fabrication of microelectronic devices.

Microelectronic devices ordinarily incorporate layered structures which include microscopic electronic elements and a generally planar layer of insulating material covering these elements. In manufacture of such devices, the layer of insulating material may be formed with small holes and a layer of metal is deposited on top of the insulating layer so that the metal layer extends into the hole to contact the electronic elements. The metal layer is then etched to form separate leads extending to the various electronic elements. Typically, the metal is deposited from the gas phase onto the insulating layer, such as by evaporation, gas phase reaction processes or, most typically, by sputtering.

In sputtering, ions are impelled against the sputter source or "target" to dislodge atoms of the source, referred to as "adatoms" which deposit on the substrate to be coated and form the desired surface layer. Ordinarily, the process is conducted under very low subatmospheric pressure by creating a plasma or mixture of gas ions and free electrons, and directing the ions towards the sputter source under the influence of an electric field. The electric field typically is created either by applying a negative DC voltage or a radio frequency ("RF") excitation signal to the sputter source. Where RF excitation is applied to the sputter source, the sputter source also becomes negatively charged because the interface between the plasma and the sputter source acts as a rectifier. RF sputtering is almost universally conducted with RF excitations at 13.56 MHz, a so-called "ISM" frequency, and at other, higher, ISM frequencies. Regulations governing stray radio frequency emission from the apparatus are far less than stringent for the ISM (industrial, scientific and medical) frequencies than for other frequencies.

The metal deposited may not adequately cover the hole walls and bottom or, when planarization is being sought, completely fill the holes in the insulating layer, and hence, may not provide reliable conductive pathways in the finished electronic device. Because the total surface area of a hole is greater than the area of the opening of the hole in the plane of the insulating layer top surface, the average amount of material deposited in the hole per unit of surface area is less than that deposited on the planar top surface. Moreover, the material deposited adjacent the opening tends to mask the deeper portions of the hole walls, leading to particularly poor coverage of the walls and formation of voids and undercuts in the deposited material. Performance requirements demand that the electrical resistance of the metal extending into the holes to contact the electronic elements be as low as possible. Therefore, in addition to good physical coverage within these contact holes, the resistivity of the material deposited (a transport property of the film) must be maintained.

The top surface of the metallic layer, remote from the insulating layer, ordinarily has an irregularity or depression in the region overlying the original hole in the insulating layer, as in the case of planarization. Such irregularities tend to create even more severe irregularities as further layers are deposited on the metallic layer during device fabrication The voids or undercuts created by unequal deposition also cause processing problems in later fabrication steps Problems of inadequate wall coverage, incomplete filling and irregular top surface configuration similar to those encountered with holes occur in the case of other nonplanar features such as grooves in a layer to be covered by a gas-phase deposited layer These problems also occur in depositing layers of materials other than metals.

These problems have become particularly acute with continued progress in other areas of microelectronic manufacture and design. All of these problems are aggravated as the size of features such as holes and grooves decreases and as the severity of the layer topography increases, i.e., as the walls of holes, grooves and the like in a substrate layer to be covered become more nearly perpendicular to the plane of the substrate layer. However, to provide further miniaturization of semiconductor devices, it is necessary to use progressively smaller holes, grooves and the like, and to employ progressively more severe layer topography. Thus, the problems noted above have posed a significant impediment to progress in microelectronics, in particular, in ultra large scale integration.

The art has therefore sought processes which can enhance step coverage over contact holes and other irregular top surface configurations and "planarize" a deposited layer, i.e., which can cause the layer to more completely fill holes and depressions in the underlying substrate layer and which provide a smoother top surface on the deposited layer. It has been known heretofore that planarization can be achieved by simply melting the deposited metallic or other layer. For example, in sputtering processes, considerable energy can be transferred to the metal or other sputter-deposited layer as adatoms of the sputtered material merge with the layer. The major portion of this energy typically is converted to heat. The temperature of the entire layer may rise above the solidus temperature of the sputtered material (the lowest melting temperature), so that bulk flow of the material occurs. Such bulk flow effectively fills holes and provides a flat top surface on the sputtered layer. However, unwanted effects such as segregation of elements from alloy layers, growth of metallic grains within the layer, heat damage to underlying electronic elements and the like render melting undesirable in most semiconductor applications.

Other approaches which have been proposed rely upon ion bombardment and/or "resputtering" of the deposited layer in a sputtering process. Thus, as disclosed in Homma et al., *Planar Deposition of Aluminum by RF/DC Sputtering with RF Bias*. J. Electro-Chemical Soc. VOL. 132, No. 6, pp. 1466–1472 (1985), RF excitation may be applied to the substrate as well as to the target or sputter source during deposition of an aluminum layer by sputtering. Just as in conventional sputtering, RF excitation has been applied in resputtering at a frequency of about 13.56 MHz. In effect, the metallic layer deposited on the substrate surface, becomes another sputter source or target. Ions from the plasma impact upon the layer and dislodge atoms of the deposited metal from the top surface of the layer. Some of the dislodged material tends to fill the holes or other surface irregularities, and to fill in low spots on the deposited layer.

At least some of the adverse effects of the melting procedure are avoided or mitigated using the resputtering approach. However, the resputtering effect markedly slows the metal deposition process. Thus, while some metal is being deposited in the layer by the principal sputtering process, some is removed by the resputtering process. To achieve good planarization with even a moderate substrate layer topography, a resputtering rate of about 50% to about 70% is considered necessary Stated another way, 50% to about 70% of the metal deposited in a given time is lost by resputtering Thus, the net rate of deposition is dramatically reduced, and productivity of the sputtering equipment is severely curtailed. Moreover, the ions bombarding the layer tend to heat it. To keep the total heat input to the layer within bounds and avoid melting the layer, the heat input supplied by sputtered adatoms must be reduced to compensate for this effect. Thus, the principal sputtering rate itself must be less than that used without resputtering. This factor, coupled with the losses caused by resputtering, results in a net deposition rate of about 10% or less than that achievable without resputtering. Stated another way, process time and hence process cost are increased tenfold with this RF resputtering approach.

Another approach, taught by Skelly et al., J. Vac. Sci. Technol. A, Vol. 4, No. 3, pp. 457-460 (May/June 1986), is the application of a DC bias to the substrate, also while the substrate is in proximity with a plasma in a sputtering process. The DC bias also causes bombardment of the layer by ions from the plasma. This is said to result in some degree of planarization. However, the planarizing effects occur principally after the process has operated for a considerable period of time, thereby indicating that the planarizing effects are caused at least in part by heat generated within the layer during the process. It therefore appears that the DC bias process involves heating and may result in bulk melting of the layer material and hence shares certain disadvantages associated with the simple melting process referred to above. The ion flux or number of bombarding ions per unit area with DC bias will necessarily be limited by space charge considerations thereby impairing the efficacy of the process. Moreover, the DC bias process typically induces some resputtering as well, typically to a resputtering rate of about 10% to about 30%. Therefore, the DC bias process considerably reduces productivity of the sputtering operation and increases its cost.

Other approaches which overcome the aforementioned disadvantages are disclosed in U.S. Pat. No. 4,756,810 with respect to planarization and U.S. Pat. No. 4,664,935 with respect to enhanced step coverage. As to planarization, a layer of a substance such as an aluminum alloy is deposited, preferably by sputtering, onto the surface of the substrate such as a semiconductor wafer. The deposited substance is redistributed by bombarding the layer with ions. The ion bombardment is induced by applying low frequency RF excitation at about 5 KHz-1 MHz to the substrate. As to step coverage, the deposition source and the semiconductor wafer are located within a process chamber which is normally operated under vacuum conditions. The deposition source has an emitting surface oriented at an angle relative to the film receiving surface of the semiconductor wafer to satisfy the reduction or substantial elimination of self-shadowing. Such angle is in the range of 10° to 45°. To further effect the reduction and elimination of the self-shadowing, the semiconductor wafer and deposition source are rotated relative to each other while the surface of the semiconductor wafer is maintained in a vertical orientation. Although these aforementioned methods overcome certain disadvantages in the art, there is still the need for improvements in layer depositing, improved step coverage and planarizing processes and apparatus.

SUMMARY OF THE INVENTION

In accordance with one embodiment of the present invention there is provided an apparatus for depositing a layer of substance on a surface of a substrate, the apparatus constructed of means for holding the substrate, and means for depositing the substance from a gaseous phase onto the surface of the substrate to form a layer of the substance thereon and creating neutral atoms or molecules from a portion of the gaseous phase. the neutral atoms or molecules being reflected at an angle to the surface of the substrate to mobilize the substance deposited thereon by collision with the neutral atoms or molecules.

In accordance with another embodiment of the present invention there is provided an apparatus for depositing a layer of a substance on a surface of a substrate, the apparatus constructing of means for holding the substrate, depositing means for depositing the substance from a gaseous phase onto the surface of the substrate to form a layer of the substance thereon, creating means for creating neutral atoms or molecules from a portion of the gaseous phase, and reflecting means for reflecting the neutral atoms or molecules at an angle to the surface of the substrate to mobilize the substance by collision with the neutral atoms or molecules.

In accordance with another embodiment of the present invention there is provided a method for depositing a layer of a substance on a surface of a substrate, the method includes depositing the substance from a gaseous phase onto the surface of the substrate to form a layer of the substance thereon, creating neutral atoms or molecules from a portion of the gaseous phase, and reflecting the neutral atoms or molecules at an angle to the surface of the substrate to mobilize the substance by collision with the neutral atoms or molecules.

BRIEF DESCRIPTION OF THE DRAWINGS

The above description, as well as further objects, features and advantages of the present invention will be more fully understood with reference to the following detailed description of a deposition apparatus and method for enhancing step coverage and planarization on semiconductor wafers, when taken in conjunction with the accompanying drawings, wherein.

DETAILED DESCRIPTION OF THE PREFERRED EMBODIMENTS

Figure 1:
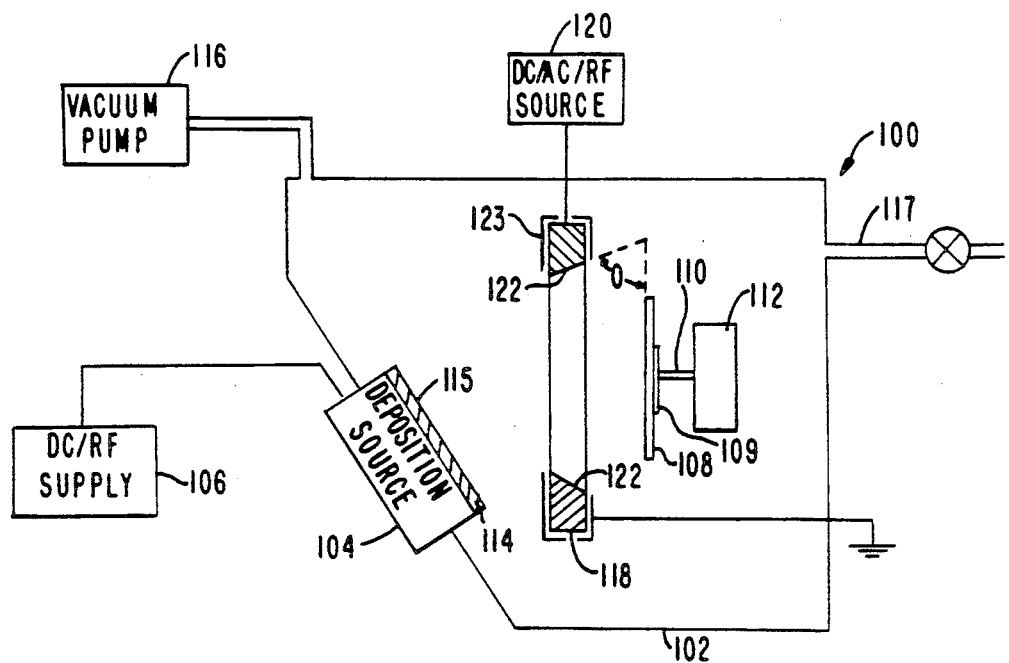
FIG. 1 is a schematic view of the apparatus according to one embodiment of the present invention.

An apparatus according to one embodiment of the present invention for applying a thin film layer to a surface of a workpiece is broadly denoted by reference numeral 100 and is shown schematically in FIG. 1. The apparatus 100 includes a chamber 102 containing a thin film deposition source 104 provided with a power supply 106 for applying a high voltage DC bias or RF power thereto. A workpiece, such as a semiconductor wafer 108 which is generally circular in configuration, is mounted in some suitable manner such as by a chuck 109 on a central shaft 110 coupled to a rotatable and tiltable drive assembly 112, whereby the shaft 110 and wafer 108 can be rotated and tilted relative to the deposition source 104. The apparatus 100 as thus far described, is of similar construction to the sputtering apparatus disclosed in U.S. Pat. No. 4,664,935.

The deposition source 104 is preferably in the nature of a planar magnetron sputter deposition source including a target source holder (not shown) arranged to hold a plate like sputter source 114 and magnets (not shown) arranged to provide generally arcuate magnetic fields in the vicinity of the sputter source. A sputter deposition source 104 of the foregoing type is more particularly described in U.S. Pat. No. 4,756,810. The structure and operation of a planar magnetron sputter deposition source are conventional and well-known in the sputtering art, and accordingly need not be described further herein. However, in the apparatus 100, the target source holder is arranged to maintain the sputter source 114 so that its front or eroding surface 115 is disposed at an acute angle to the planar front surface of the wafer 108. The planar magnetron sputter deposition source also includes appropriate means for maintaining the sputter source 114 electrically insulated from the walls of the chamber 102 and a lead for connecting the sputter source to an RF power supply such as power supply 106. The RF power supply is arranged to apply RF excitation to the sputter source 114 at an excitation frequency of 13.56 MHz. The amplitude of these excitations is controlled by control means (not shown). A conventional vacuum pump 116 and inert gas supply 117 are also connected to the interior of the chamber 102. Conventional instrumentation (not shown) are also connected within the chamber 102 for monitoring the pressure within the chamber and the temperature of objects within the chamber.

In accordance with the present invention, there is provided a collector/neutralizer/reflector electrode 118 arranged within the chamber 102 between the deposition source 104 and wafer 108. The electrode 11,8 is connected to a power source 120 which supplies either a DC bias, AC bias or RF power to the electrode, or combinations thereof. If the electrode 118 or sputter source 114 or deposition source 104 is of electrically insulating material, then the power source 120 will be a source of RF power. For simplicity of design and operation of the apparatus 100, it is generally preferred to maintain the electrode 118 at a negative DC bias potential relative to the plasma produced by the deposition source 104 so that it will attract positive ions from the plasma. The electrode 118 is constructed in the shape of an annular ring having an inner planar surface 122 disposed at preferably an obtuse angle to the planar front surface of the wafer 108. The remaining exterior surfaces of the electrode 118 are surrounded by a conductive shield 123 connected to ground potential. Although the electrode 118 has been shown and described as being an annular ring, it is to be understood that other shapes such as oval, rectangular and the like may be utilized in accordance with the present invention, as well as a plurality of electrodes arranged in different orientations as to be described hereinafter.

Figure 2:
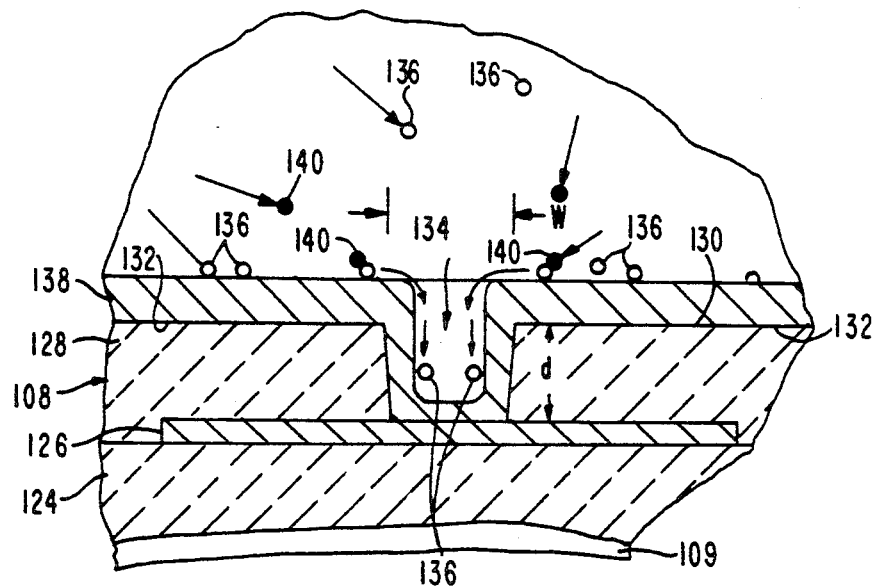
FIG. 2 is a fragmentary, idealized schematic view on a greatly enlarged scale depicting a portion of a semiconductor wafer during processing according to the present invention to provide enhanced step coverage.

In a process according to one embodiment of the present invention, a semiconductor wafer 108 is mounted to the chuck 109 attached to the drive assembly 112. As best seen in FIG. 2, the wafer 108 is in the nature of a multilayer semiconductor structure. The structure includes an electrically insulating back layer 124, an active semiconductor device region or element 126 and an electrically insulating front layer 128. Front layer 128 has a generally flat front surface 130 comprising flat, coplanar lands 132 and a through contact hole 134 extending into the substrate, perpendicular to the plane of the lands, to active semiconductor device region or element 126. As will be appreciated, the size of these features is greatly exaggerated in FIG. 2. Typically, each of the layers is on the order of two micrometers or less in thickness. The diameter (w) of the contact hole 134 may be about 1 to 2 micrometers and the depth (d) of the contact hole may be about 1 micron. The term "aspect ratio" as used in this disclosure with reference to a hole means the depth of the hole divided by its diameter. Contact hole 134 may have an aspect ratio of about 0.5 or more, and about 1.0 or more in a wafer with particularly severe topography. Also, the circumferential wall of the contact hole may extend substantially perpendicular to the plane of lands 132. As will also be appreciated, the entire wafer 108 incorporates thousands of active semiconductor device regions or elements 126, and thousands of through contact holes 134. Also, the front surface 130 of the semiconductor wafer 108 may include other recesses, such as grooves, notches, etc., extending into the wafer from the lands 132.

In accordance with the above-described apparatus 100, the front or eroding surface 115 of the sputter source 114 and the front surface 130 of the semiconductor wafer 108 define an acute angle between them. This angle preferably is between about 10° and about 45°, and most preferably, about 30°. In the process illustrated, the sputter source 114 is formed from a variety of materials, including metals, non-metals and metal alloys, for example, aluminum, titanium, tungsten, titanium nitride, gold, copper, nickel, cobalt, silicon nitride, silicon dioxide, aluminum oxide or the like.

The vacuum pump 116 and inert gas source 117 are actuated to purge the chamber 102, to fill the chamber with substantially pure inert gas, reactive gases or mixtures thereof, and to bring the chamber to an internal pressure of less than about $5 \times 10^{-7}$ Torr, and preferably even lower. The desired gas or gas mixture may be selected from a variety of gases, such as noble gases, including but not limited to helium, argon, neon and mixtures thereof, or reactive gases, such as nitrogen, oxygen and the like which will react with the sputtered material from the sputter source 114 to form the material being deposited on the wafer 108. For those reasons as to be described hereinafter, it is preferred that the atomic mass of the atoms or molecules of the plasma formed within the chamber 102 be less than the atomic mass of the material being deposited from the sputter source 114. Particular useful combinations by way of example only are considered to be aluminum or titanium with helium or neon, neon being preferred, tungsten with noble gases such as argon, and as to reactive combinations, titanium with nitrogen to form titanium nitride, silicon with nitrogen or oxygen to form silicon nitride and silicon dioxide, and aluminum with oxygen to form aluminum oxide. It is also contemplated that mixtures of inert gases or inert gases and reactive gases may be employed, one inert gas or reactive gas designated for creating a plasma to perform the sputtering operation, while the other inert gas being adapted to provide enhanced step coverage and/or planarization in accordance with the present invention.

The semiconductor wafer 108 is preheated to a temperature between about 150° C. and about 450° C., and most preferably, between 250° C. and about 350° C. In the case of sputtering, the sputter source RF power supply 106 is actuated to apply RF excitation to the sputter source 114. The RF excitation creates a self-sustaining electrical discharge between the eroding surface 115 of the sputter source 114 and the walls of the chamber 102, thereby converting the rarified gas within the chamber into a plasma. In the case of a magnetron sputter source, the magnets will aid in creation of a self-sustaining glow discharge at the low gas pressures employed.

The plasma created by the glow discharge comprises positively charged ions of the gas and free electrons. The RF excitation applied to the sputter source 114 induces a strong negative bias, so that the gas ions from the plasma impact on the eroding surface 115 of the sputter source 114 dislodging uncharged adatoms 136 of the material being deposited. These dislodged adatoms 136 are in the gas phase, and pass towards the front surface 130 of the semiconductor wafer 108. The free adatoms 136 do not generally follow straight, linear paths from eroding surface 115 of the sputter source 114 to the front surface 130 of the semiconductor wafer 108. Also, adatoms 136 arrive at front surface 130 with velocities oriented with many different directions. However, the vector sum of all these different velocities is generally along the vector normal to the eroding surface 115 of the sputter source 114. The adatoms 136 arriving on the front surface 130 of the semiconductor wafer 108 accumulate in a deposited layer 138.

During the deposition process, the semiconductor wafer 108 may be rotated about an axis normal to its front surface 130 and tilted by the drive assembly 112. Preferably, the speed of rotation is selected so that less than 1% of the layer 138 is deposited during each revolution of the semiconductor wafer 108, and so that the speed of rotation is at least about 50RPM. The momentum imparted by the adatoms 136 will be directed in different directions parallel to the front surface 130 of the semiconductor wafer 108 at different times during each revolution.

A negative bias potential relative to the plasma produced by the deposition source 104 is applied to the electrode 118 by voltage source 120 so that it will attract positive ions from the plasma. The plasma may also be produced by the electrode 118 itself as to be described hereinafter. Upon bombarding the inner surface 122 of the electrode 118 (the remaining surfaces being shielded at ground potential by shield 123), all but a very small fraction (typically than 1 in 10,000) will become neutral atoms and/or neutral molecules. In the preferred embodiment, the gas is selected so that the atomic mass of the incident positive ion from the plasma is substantially less than the atomic mass of the atoms or molecules formed upon the inner surface 122 of the electrode 118, whereby a large fraction will be elastically scattered, thus retaining a large fraction of their kinetic energy. Since the reflected atoms or molecules are, by definition, electrically neutral, they are not affected, i.e., cannot be deflected or steered, by any electric field either from the discharge plasma or bias potentials applied to the wafer front surface 130 or by any other potentials. The mean angle of bombardment is therefore determined primarily by the orientation of the inner surface 122 of the electrode 118. By neutral, it is generally meant that the reflected atoms or molecules have no net electrical charge, although they may be chemically active, i.e., reactive gases as opposed to noble gases. These neutral atoms or molecules are generally not in their ground state, rather being in their excited state or even metastable state.

Figure 3:
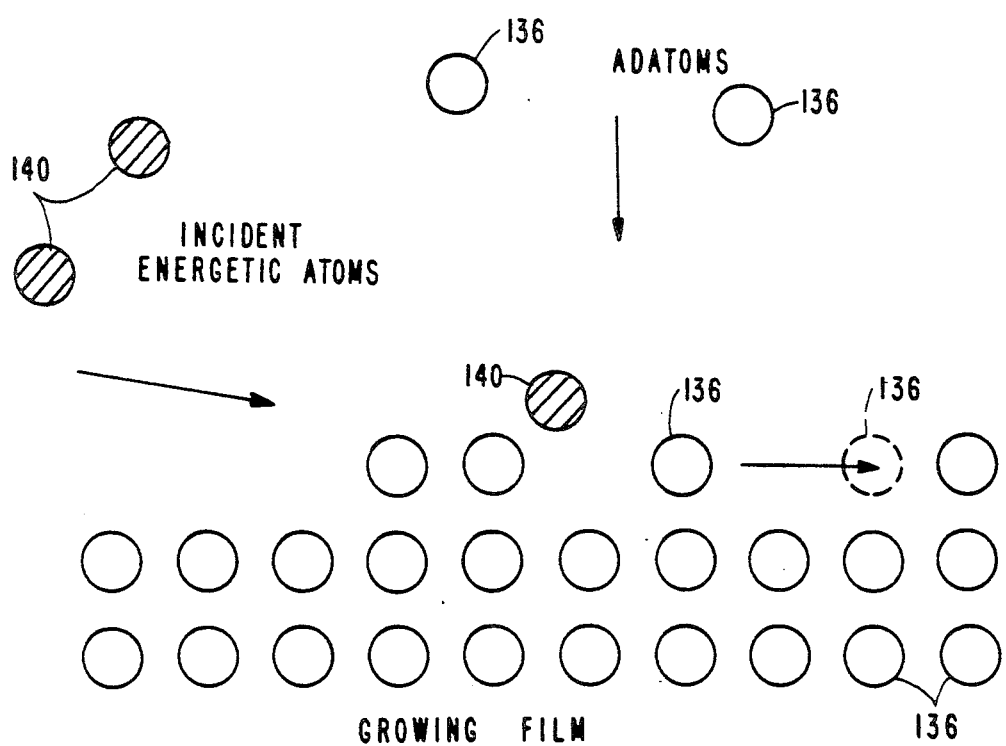
FIG. 3 is an idealized schematic view on a greatly enlarged scale depicting the mobility of adatoms by bombardment with energetic neutral atoms or molecules in accordance with the present invention.

As shown in FIGS. 2 and 3, the reflected neutral atoms or molecules 140 bombard the growing deposited layer 138. These neutral atoms or molecules 140 interact with the adatoms 136 at the surface of the growing layer 138. As will be appreciated, FIG. 3 represents an idealized, theoretical conception of such interaction, and the present invention is not limited by any such theory of operation. Regardless of the mechanism of operation, the neutral atoms or molecules 140 bombarding the adatoms 136 mobilize the deposited layer 138, and the deposited layer thus spreads into any lower spots in the layer, i.e., into contact holes 134 and any other depressions (not shown) in the wafer front surface 130.

Figure 4:
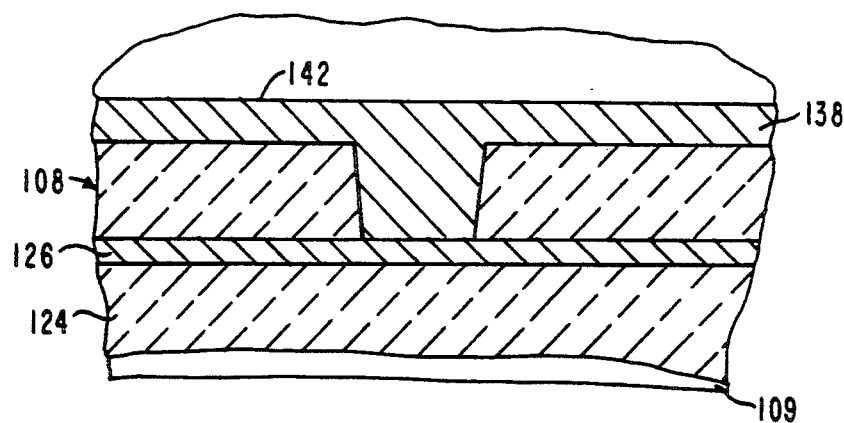
FIG. 4 is a fragmentary, idealized schematic view on a greatly enlarged scale depicting a portion of a semiconductor wafer during processing according to the present invention to provide enhanced planarization.

The flux of the energetic neutral atoms or molecules 140 is a significant fraction of the flux of the arriving adatoms 136 which will adhere and become part of the growing deposited layer 138. In this regard, the energy of the energetic neutral atoms or molecules 140 is in excess of that required to cause a condensed adatom 136 to move from its present position at least one nearest neighboring distance on the surface of the growing deposited layer 136, typically 25 eV, yet significantly less then would be required to cause effective resputtering of the growing deposited layer 138. In this regard, it is noted that the energy required to move an adatom 136 from its location to the nearest neighboring position is typically only a few eV less than that required to move an adatom from its present location to the next nearest neighboring position. As a consequence, it is not practical to define an upper limit for the energy of the bombarding neutral atoms or molecules 136. In practical terms, the upper limit may be specified in terms of the net result, wherein it is desired to have a removal rate, i.e., resputtering which is less than 5% of the arrival rate of the adatoms 136 from the sputter source 114. The mobilized deposited layer 138 provides enhanced step coverage and, to the extent desired, provides planarization to fill in any depressions and to provide a substantially planar top surface 142 on the deposited layer 138 as shown in FIG. 4.

As thus far described, the present invention provides an improved apparatus and method for depositing of a thin film of a substance on a semiconductor wafer wherein the deposited film has the desired thickness profile, the deposition provides enhanced step coverage and planarization over severe geometrical structures on the workpiece, and the morphology of the film is effectively controlled to thereby avoid the problems associated with these factors when a conventional apparatus and method are used for the deposition of such films on a semiconductor wafer.

The operation of the deposition source 104, for example, a planar magnetron sputter deposition source, is considered conventional as known from, for example, U.S. Pat. Nos. 4,756,810 and 4,664,935. It is therefore contemplated that the usual conditions whereby the maximum power tolerated by the sputter source 114 will be employed. For most refractory materials, the power level will be between 1 kW and 5 kW for a typical planar magnetron sputter deposition source such as that commercially available from Machine Technology, Inc. of Parsippany, N.J.

The pressure of the plasma within the chamber 102 is relevant only in that it should not be too high relative to the "throw distance". By "throw distance" it is meant the mean distance from the source to the substrate. The critical "throw distance" is related to the plasma pressure by the relationship that the product of critical pressure and critical distance is a constant. By "critical pressure" it is meant the pressure above which significant degradation of the effective enhancement is experienced due to energetic particle loss from gas phase scattering for a given throw distance. By "critical distance" it is meant the distance above which significant degradation of the effective enhancement is experienced due to energetic particle loss from gas phase scattering for a given pressure. For planar magnetron sputter deposition sources with a throw distance the order of 10 Cm, optimum performance is obtained with a plasma pressure of less than about $2 \times 10^{-3}$ Torr. Although higher pressures may be employed, for example, up to $8 \times 10^{-3}$ Torr, such higher pressures may result in increasing degradation of the effective enhancement. As previously noted, the atomic mass of the sputtering gas relative to the atomic mass of material being sputtered should be designated for optimum performance. In this regard, it is contemplated that the mass of the gas atom should be less than the order of half that of the sputtered atom. However, as noted above, other relative values of the atomic mass of the sputtering gas relative to the atomic mass of the material being sputtered may be employed without departing from the present invention.

It is contemplated that the DC negative voltage applied from voltage source 120 to the reflector electrode 118 will yield optimum results when in the order of a few hundred volts or less. The effects of applied voltage is expected to relate more to semiconductor device damage within the wafer 108 then in effecting step coverage and/or planarization. Similarly, the reflector electrode current is expected to be optimized at a value in the same order of magnitude as the ion current to the sputter source 114. As to the angle of the inner surface 122 of the electrode 118 with respect to the surface of the semiconductor wafer 108, such angle will typically be such that the wafer surface 130 should be uniformly "illuminated" by the inner surface, as if the inner surface were an optically uniformly illuminated diffusing surface. Thus, it is to be appreciated that the angular relationship for a 6 inch wafer may be in the order of 90° to 60°, and preferably about 80°.

Figure 5:
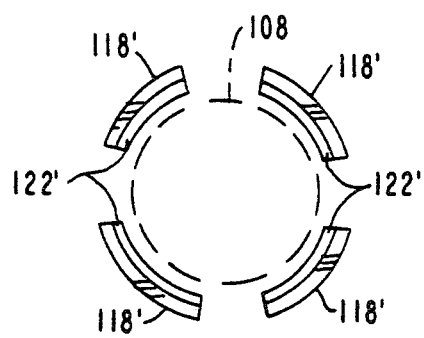
FIG. 5 is a bottom plan view of the arrangement of a reflector electrode in the nature of annular segments in accordance with one embodiment of the present invention.
Figure 6:
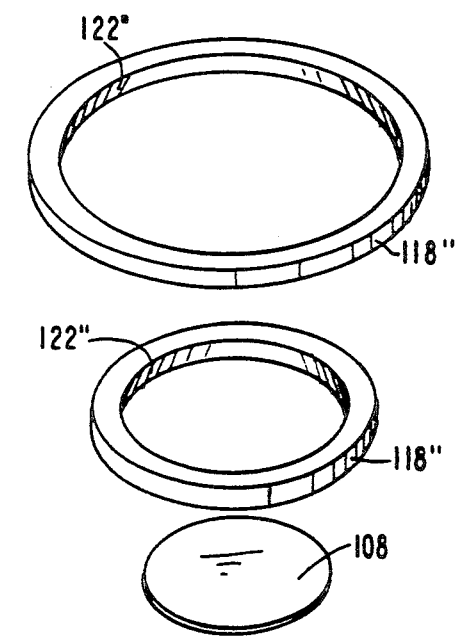
FIG. 6 is a perspective view of the arrangement of a pair of reflector electrodes each of different size in the nature of annular rings contained within parallel planes in accordance with another embodiment of the present invention.
Figure 7:
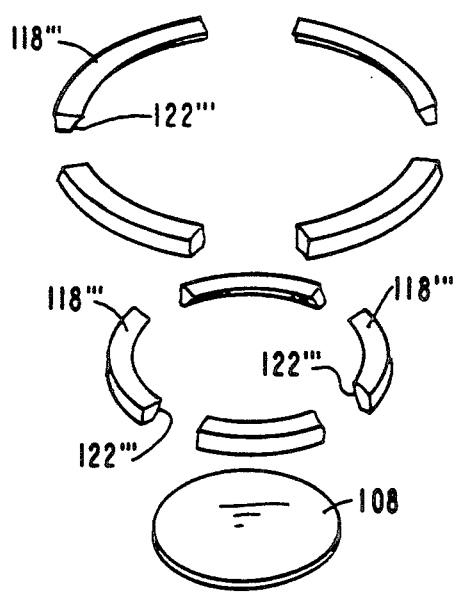
FIG. 7 is a perspective view of the arrangement of a plurality of reflector electrodes in the nature of annular segments arranged in rings of different size and contained within parallel planes in accordance with another embodiment of the present invention.

Referring now to FIGS. 5, 6 and 7, there is disclosed various embodiments of the construction and arrangement of the electrode 118 for enhanced step coverage and planarization in accordance with the present invention. More specifically with reference to FIG. 5, the electrode is constructed in the nature of a plurality of annular segments 118' positioned about the circumference of an imaginary circle within a common plane. As shown in FIG. 6, the plural electrodes are in the nature of a pair of concentric annular rings 118', arranged in respective parallel planes above the wafer 108. The electrode 118' most distant from the wafer 108 is of larger diameter than the electrode closest to the wafer. As shown in FIG. 7, the plural electrodes are in the nature of a pair of concentric annular rings each formed from a plurality of annular segments 118''', likewise disposed in respective parallel planes to the wafer 108 and of different diameters. Accordingly, it can be appreciated that a variety of shapes and arrangements for the electrode 118 may be employed in accordance with the apparatus 100 and method of the present invention without departing therefrom.

To prevent contamination of the wafer 108 during the sputtering operation, it is preferred that the electrode 118 be formed of the same material as that being deposited from the sputter source 114. However, during the initial operation of the apparatus 100, the sputtering process will internally coat all components within chamber 102 with material from the sputter source 114. The electrode 118 may therefore be constructed of such materials as stainless steel and preconditioned by operation of the apparatus 100 for a short interval prior to loading the chamber 102 with a wafer 108. In this regard, the pretreatment will result in material from the sputter source 114 being deposited onto, for example, the inner surface 122 of the electrode 118 to prevent contamination from the electrode material during the sputtering operation and wafer coating process.

Figure 8:
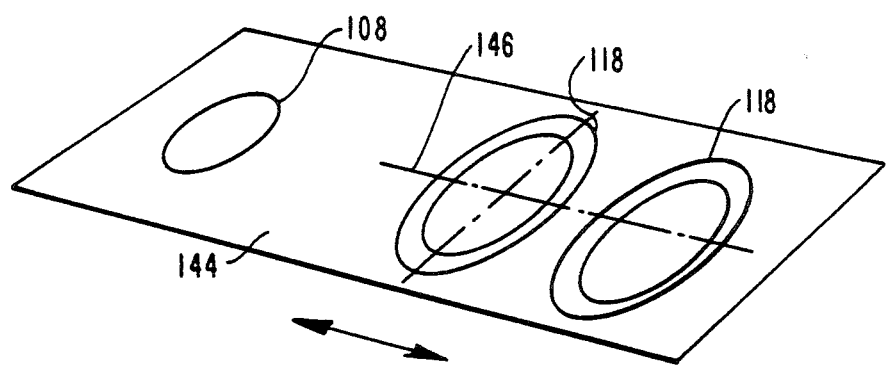
FIG. 8 is a perspective view of an arrangement of a plurality of reflector electrodes of oval shape shown in relationship to an underlying supported semiconductor wafer by a translatable table in accordance with one embodiment of the present invention.
Figure 9:
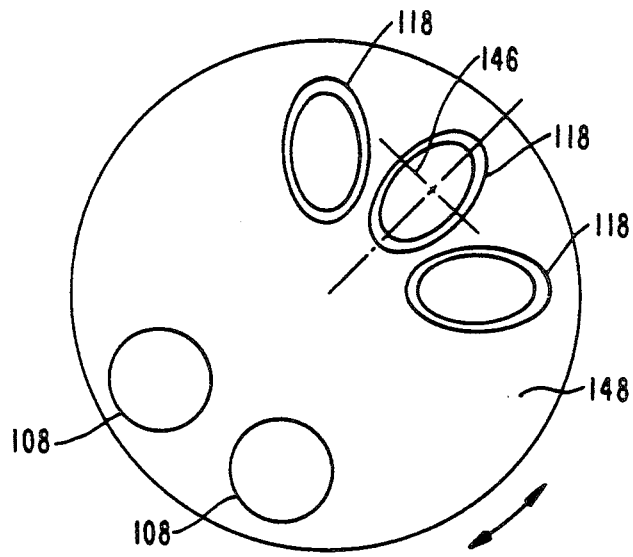
FIG. 9 is a perspective view of an arrangement of a plurality of reflector electrodes of oval shape shown in relationship to underlying supported semiconductor wafers by a rotatable table in accordance with another embodiment of the present invention.
Figure 10:
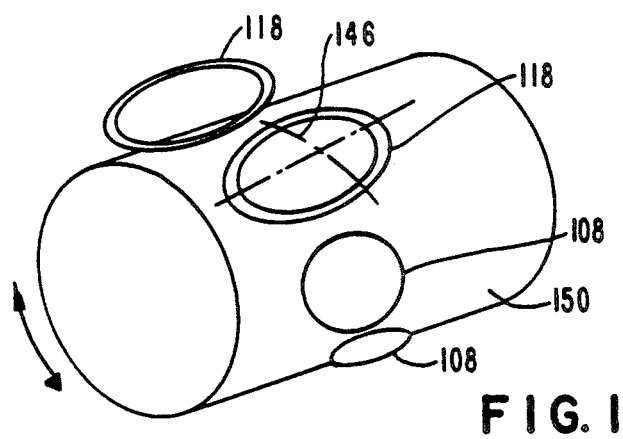
FIG. 10 is a perspective view of an arrangement of a plurality of reflector electrodes of oval shape shown in relationship to underlying supported semiconductor wafers by a rotatable drum in accordance with another embodiment of the present invention.

Referring briefly once again to FIG. 1, the wafer 108 is secured to a rotatable and tiltable drive assembly 112 by means of shaft 110 and chuck 109. The wafer 108 is thereby positioned opposing the electrode 118. Referring to FIGS. 8, 9 and 10, alternative arrangements for positioning the wafer 108 and electrode 118 are shown. For example, as shown in FIG. 8, the wafer 108 is supported on a generally flat translatable table 144 adapted for reciprocal linear motion as indicated by the double-headed arrow. Overlying the table 144 and spaced above wafer 108 are one or more oval shaped electrodes 118 having their short axis 146 in alignment with the direction of reciprocal movement of the table. In this manner, the wafer 108 may be reciprocally translated underneath one or more of the electrodes 118.

As shown in FIG. 9, one or more wafers 108 are supported about the peripheral portion of a circular table 148 adapted for rotation about its axis in either a clockwise or counterclockwise direction as indicated by the double-headed arrow. Overlying the table 148 above the wafers 108 are a plurality of oval shaped electrodes 118 having their respective short axis 146 arranged along the circular path of the wafers. In this regard, the wafers 108 may be positioned beneath one or more of the electrodes 118 as the table 148 is rotated in a counter clockwise or clockwise direction. A variation of the circular table 148 is the provision of a cylindrical drum 150 for supporting one or more wafers 108 as shown in FIG. 10. As the cylindrical drum 150 is rotated about is longitudinal axis in a clockwise or counter clockwise direction, as indicated by the double headed arrow, the wafers 108 are brought into a position underlying one or more of the electrodes 118. It should therefore be appreciated that the particular manner of bring a wafer 108 underlying a portion of an electrode 118 may be accomplished in a variety of arrangements and the foregoing embodiments are merely illustrative of this.

Figure 11:
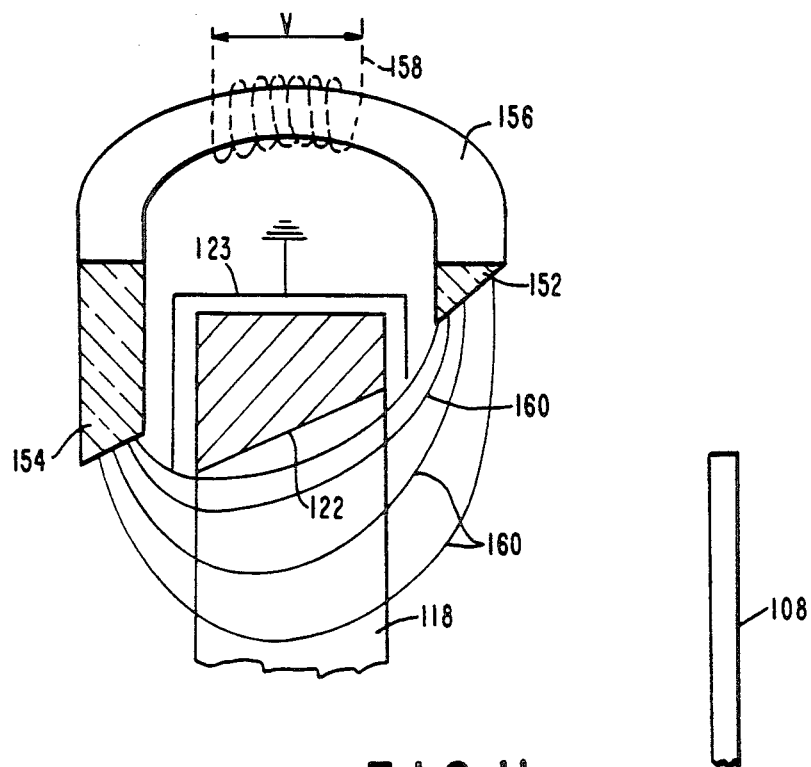
FIG. 11 is a partial cross-sectional diagrammatic view showing the construction of a reflector electrode having magnetic enhancement in accordance with one embodiment of the present invention.

It is contemplated that increasing the bombardment current density to the electrode 118 by some means such as magnetic enhancement will increase step coverage and enhance planarization of the wafer 108. Various embodiments of the present invention to provide magnetic enhancement of the electrode 118 are disclosed in FIGS. 11, 12 and 13 where like elements are represented by like reference numerals. The benefit of magnetic enhancement is to increase the flux of neutral atoms or molecules which correspond to the current density of the charged particles. Referring to FIG. 11, a cross-sectional portion of an electrode 118 provided with magnetic enhancement is shown in relationship to wafer 108. In this regard, a pair of pole pieces 152, 154 are positioned circumferentially about either side of the electrode 118. Suitable pole pieces 152, 154 are those constructed of ferromagnetic material and the like. The pole pieces 152, 154 are connected by, in cross-section, a U-shaped permanent magnet 156. In the alternative, the permanent magnet 156 may be substituted by an electromagnet formed from a U-shaped member of soft iron wrapped by a wire coil 158 connected to a voltage source V as shown in phantom. In either case, lines of magnetic flux 160 extend between the two pole pieces 152, 154 in front of the inner surface 122 of the electrode 118. The magnetic field so created results in an increased flux of ions from the plasma in the vicinity of the electrode 118 opposing the inner surface 122. As a result, there is supplied an increased current to the electrode 118 resulting in the generation of an increased flux of neutral atoms or molecules 140 which, in accordance with the present invention, will provide enhanced step coverage and planarization.

Figure 12:
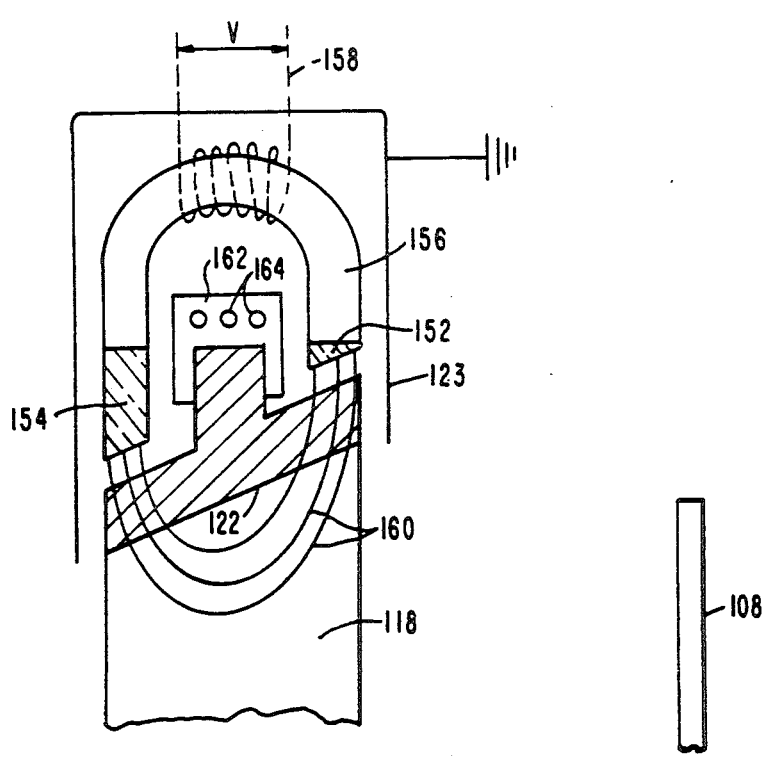
FIG. 12 is a partial cross-sectional diagrammatic view showing the construction of a reflector electrode having magnetic enhancement in accordance with another embodiment of the present invention.

Referring to FIG. 12, the electrode 118 is designed to have a T-shaped cross-section which permits arrangement of the pole pieces 152, 154 to be confined within the right and left side boundaries of the electrode. As a result, the lines of magnetic flux 160 created between the pole pieces 152, 154 emanate from within the electrode 118 opposite one pole piece and return through the electrode to the other pole piece. In contrast, the lines of magnetic flux 160 as shown in the embodiment of FIG. 11 extend primarily in front of the inner surface 122 of the electrode 118 as opposed to penetrating the electrode as shown in FIG. 12. The lines of magnetic flux 160 by passing through the electrode 118 imparts more energy to the free electrons as they move along the lines of magnetic flux thereby providing better ionization of the plasma and providing a self-sustaining plasma. By self-sustaining plasma it is meant that at low gas pressures, the plasma will ignite, i.e., glow, by itself and be sustained without the input of auxiliary power. The electrode 118 may be provided with a copper heat sink 162 having a plurality of passageways 164 adapted to accommodate cooling fluid for controlling the temperature of the electrode 118.

Figure 13:
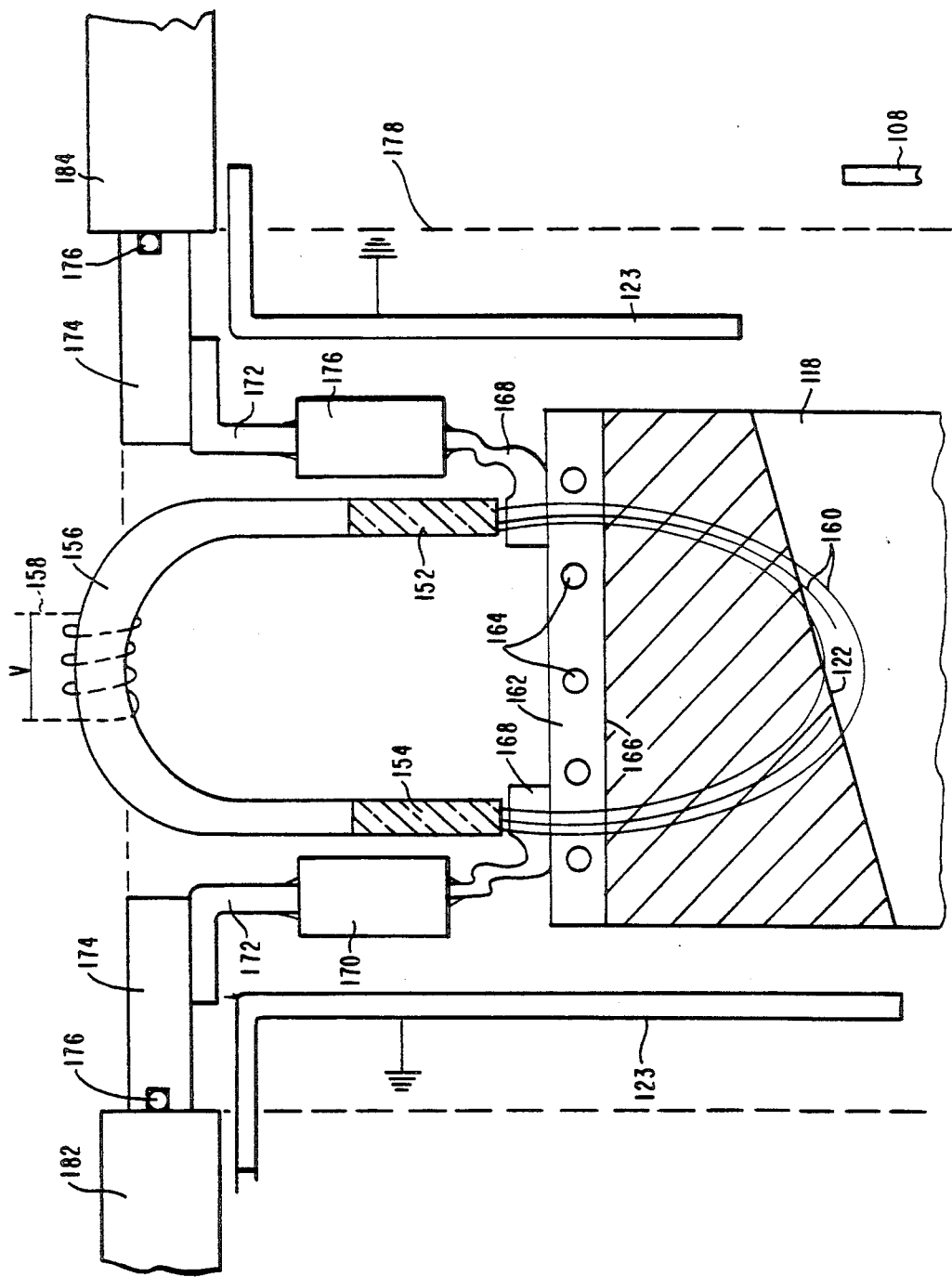
FIG. 13 is a partial cross-sectional diagrammatic view showing the construction of a reflector electrode having magnetic enhancement in accordance with another embodiment of the present invention.

Referring now to FIG. 13, a contemplated preferred embodiment of the electrode 118 is shown. The electrode 118 has a cross-sectional shape similar to the electrode disclosed in FIG. 11 so as to have an outer peripheral surface 166 which may be attached to heat sink 162 for cooling the electrode. Attached to the outer edges of the heat sink 162 are a pair of spaced apart L-shaped metal stand-offs 168 having a central portion constructed to accommodate thermal expansion. The upwardly extending ends of the stand-offs 168 are braised to a metallized layer provided on ceramic insulators 170. The opposite end of the ceramic insulators 170 are braised to spaced apart L-shaped stand-offs 172 which, in turn, are welded to rings 174 constructed from nonmagnetic stainless steel. The outer edge of the rings 174 support an O-ring 176.

Disposed between the rings 174 and ceramic insulators 170 are the pair of pole pieces 152, 154 arranged opposing stand-offs 168. As previously described, the pole pieces 152, 154 are connected by a permanent magnet 156 or electromagnet formed from soft iron wrapped with a wire coil 158. Surrounding the electrode 118 on either side are a pair of grounded conductive shields 123 as previously described. The thus far described electrode ring 118 and related structure forms a subassembly contained within the dotted lines and generally indicated by reference numeral 178.

Figure 14:
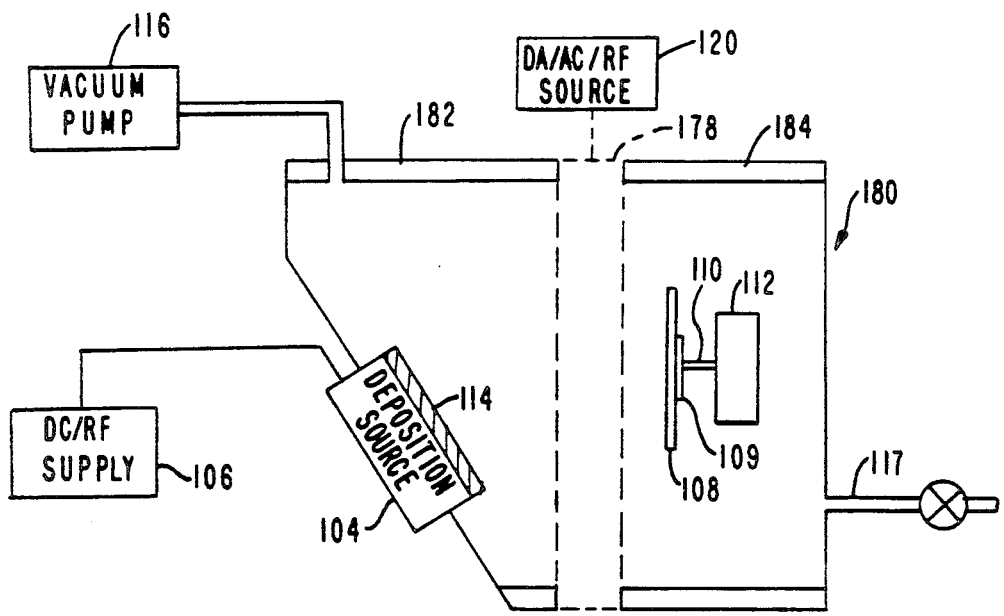
FIG. 14 is a schematic view of the apparatus according to one embodiment of the present invention adapted to receive a modular subassembly including the reflector electrode.

The subassembly 178 is adapted to be used in the embodiment of the apparatus 180 as shown in FIG. 14. In this regard, the apparatus 180 is constructed of a pair of spaced apart cylinders 182, 184 constructed of non-magnetic stainless steel. Cylinder 184, by way of example, contains the drive assembly 112 and wafer 108, while cylinder 182 contains the deposition source 104. The subassembly 178 is positioned between the cylinders 182, 184 and forms a vacuum seal therewith by means of the O-rings 176 provided along the circumferential edges of rings 174. The subassembly 178 may accordingly be considered modular in design in that it is easily replaceable with other such subassemblies as desired.

The lines of magnetic flux 160 by extending through the electrode 118 are concentrated about the inner surface 122 thereby enhancing the flux of ions from the plasma and accordingly the flux of the neutral atoms or molecules 140 being generated by the electrode. As previously described, this provides better ionization of the plasma, as well as a plasma which is self-sustaining. To this end, it is contemplated that the electrode 118 described with reference to FIGS. 11, 12 and 13, and in particular the electrode of FIG. 13, may be used additionally as a source of the sputtered material. That is, the electrode 118 would be constructed from the material desired to be sputtered, thereby eliminating the necessity of providing a separate deposition source 104 and accompanying DC/RF power supply 106.

The gas ions from the plasma will impact on the inner surface 122 of the electrode 118 so as to dislodge uncharged adatoms 136 of the material being deposited. The dislodged adatoms 136, being in the gas phase, will ultimately deposit on the front surface 130 of the semiconductor wafer 108. The electrode 118 by being maintained at a negative bias potential will in turn attract positive ions from the plasma. Upon bombardment of the inner surface 122 of the electrode 118, these ions will become neutral atoms and/or neutral molecules 140 which will, as previously described, reflect at an obtuse angle to the surface of the wafer 108 to enhance step coverage and/or planarization as desired. By virtue of the foregoing examples of the electrode 118 being capable of generating a self-sustaining plasma discharge, it is possible to use an evaporation or chemical vapor deposition source, for example, with a deposition process that does not supply any ions. In view of the foregoing teachings, the great versatility of the apparatus 100 and method of the present invention should now be appreciated.

Figure 15:
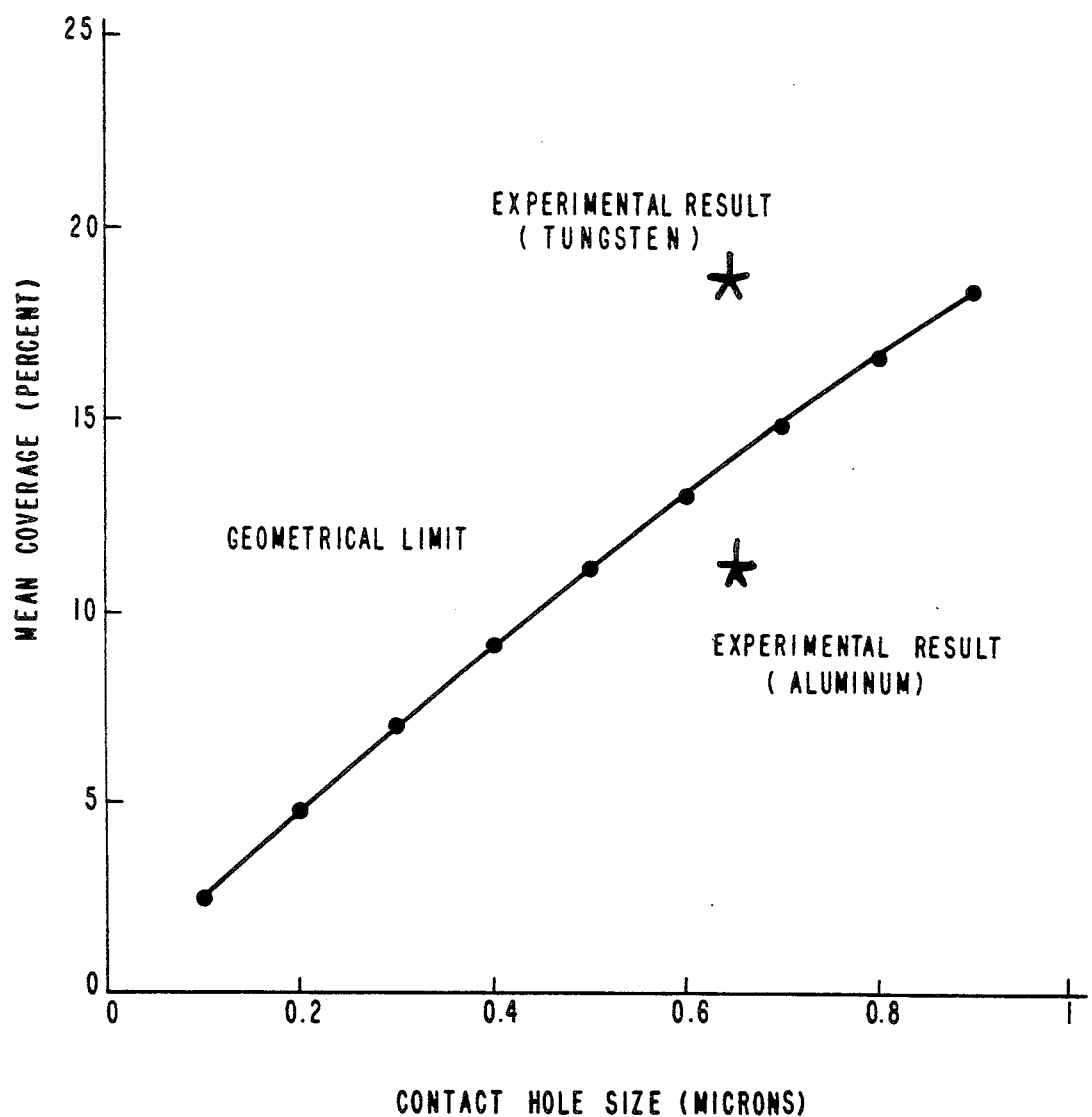
FIG. 15 is a graph showing the mean coverage of contacting holes on a theoretical and experimental basis.

Simple geometric considerations limit the maximum possible mean coverage within the contact holes 134 to a fraction of the field thickness in the absence of the present invention. This effect is shown in FIG. 15. Also illustrated is the results achieved by the apparatus and method of the present invention with a reflected flux of neutral atoms or molecules 140 estimated to be only a few percent of the incident flux of adatoms 136. As shown, for a contact hole size of 0.6 microns the depositing of a layer of tungsten in accordance with the present invention results in a percentage mean coverage slightly greater than the theoretical geometrical limit. In other words, it is shown that the thickness of the film deposited on the side walls and bottom of the contact hole 134 includes more material deposited then which would normally cover the size of the contact hole for a 1 micron oxide layer. This result is achieved from the mobility of the adatoms 136 resulting from bombardment by the neutral atoms or molecules 140 in accordance with the apparatus and method of the present invention. On the other hand, the deposition of aluminum by convention sputtering results in a mean coverage of less then the geometrical limit.

As these and other variations and combinations of the features described above can be utilized without departing from the present invention as defined in the claims, the foregoing description of the preferred embodiment should be taken by way of illustration rather than by way of limitation of the present invention as defined in the claims.

What is claimed is:

1. Apparatus for depositing a layer of a substance on a surface of a substrate, said apparatus comprising means for holding said substrate, depositing means for depositing said substance in the presence of a plasma from a gaseous phase onto said surface of said substrate to form a layer of said substance thereon, creating means for creating neutral atoms or molecules from a portion of said gaseous phase independent of said separate from said depositing means, said creating means comprising an electrode having a reflecting surface for reflecting said neutral atoms or molecules at an angle to the surface of said substrate to mobilize said substance deposited thereon by collision with said neutral atoms or molecules, first means for controlling the operation of said depositing means, and second means for controlling the operation of said creating means, said second means operable for controlling the creation and energy level of said neutral atoms or molecules independently from the depositing of said substance by operation of said first means, said second means controlling said creating means whereby ions from said plasma which form said neutral atoms or molecules have an energy level deficient for effecting sputtering of said electrode, said neutral atoms or molecules having an energy level sufficient to effect mobilization of said layer of said substance while an energy level deficient for effective resputtering of said substance from said substrate.

2. The apparatus as set forth in claim 1, wherein said depositing means comprises a sputter source.

3. The apparatus as set forth in claim 1, wherein said portion of said gaseous phase comprise a plasma.

4. The apparatus as set forth in claim 1, wherein said substance has an atomic mass greater than the atomic mass of said neutral atoms or molecules.

5. The apparatus as set forth in claim 1, wherein said reflecting surface is arranged such that said neutral atoms or molecules are reflected at an oblique angle to the surface of said substrate.

6. The apparatus as set forth in claim 1, wherein said creating means is in the shape of an annular ring arranged between said substrate and said depositing means.

7. The apparatus as set forth in claim 6, wherein said annular ring comprises a plurality of annular segments.

8. The apparatus as set forth in claim 1, wherein said substrate comprises a semiconductor wafer.

9. The apparatus as set forth in claim 1, further including magnetic means for creating a magnetic field in operative association with said creating means for increasing the flux of said neutral atoms or molecules.

10. The apparatus as set forth in claim 9, wherein said magnetic means comprises a magnetic source.

11. The apparatus as set forth in claim 1, wherein said reflecting surface is arranged such that said neutral atoms or molecules are reflected at an angle of from about 60° to 90 degrees to the surface of said substrate.

12. Apparatus for depositing a layer of substance on a surface of a substrate, said apparatus comprising means for holding said substrate, means for depositing said substance in the presence of a plasma from a gaseous phase into said surface to form a layer of said substance thereon, creating means comprising an electrode for creating neutral atoms or molecules from a portion of said gaseous phase independent of and separate from said depositing means, said neutral atoms or molecules being reflected from said electrode at an angle to the surface of said substrate in the range of about 60° to 90° degrees to mobilize said substance deposited thereon by collision with said neutral atoms or molecules, first means for controlling the operation of said depositing means, and second means for controlling the operation of said creating means, said second means operable for controlling the creation of said neutral atoms or molecules independently from the depositing of said substance by operation of said first means, said second means controlling said creating means whereby ions from said plasma which form said neutral atoms or molecules have an energy level deficient for effecting sputtering of said electrode, said neutral atoms or molecules having an energy level sufficient to effect mobilization of said layer of said substance while an energy level deficient for effective resputtering of said substance from said substrate.

13. The apparatus as set forth in claim 12, wherein said means comprises a sputter source.

14. The apparatus as set forth in claim 12, wherein said portion of said gaseous phase comprises a plasma.

15. The apparatus as set forth in claim 12, wherein said substance has an atomic mass greater than the atomic mass of said neutral atoms or molecules.

16. The apparatus as set forth in claim 12 further including magnetic means for creating a magnetic field in operative association with said depositing means for increasing the flux of said neutral atoms or molecules.

17. The apparatus as set forth in claim 16, wherein said magnetic means comprises a magnetic source.

18. The apparatus as set forth in claim 12, wherein said substrate comprises a semiconductor wafer.

19. A method for depositing a layer of substance on a surface of a substrate, said method comprising providing a source of said substance to be deposited, depositing said substance originating from said source in the presence of a plasma from a gaseous phase onto said surface of said substrate to form a layer of said substance thereon, controlling the depositing of said substance originating from said source, creating neutral atoms or molecules from a portion of said gaseous phase from an electrode independent of and separate from said source of said substance, reflecting said neutral atoms or molecules from said electrode at an angle to the surface of said substrate, and controlling the creating and energy level of said neutral atoms or molecules from said electrode independent of controlling the deposition of said substance, said being such that ions from said plasma which form said neutral atoms or molecules have an energy level deficient for effective sputtering of said electrode, said neutral atoms or molecules having an energy level sufficient to mobilize said substance by collision with said neutral atoms or molecules while an energy level deficient for effective resputtering of said substance from said substrate.

20. The method as set forth in claim 19, wherein said depositing comprises sputtering.

21. The method as set forth in claim 19, wherein said gaseous phase comprise a plasma.

22. The method as set forth in claim 19, wherein said substance has an atomic mass greater than the atomic mass of said neutral atoms or molecules.

23. The method as set forth in claim 19, wherein said neutral atoms or molecules are reflected at an oblique angle to the surface of said substrate.

24. The method as set forth in claim 19, wherein said depositing, reflecting and creating occur concurrently.

25. The method as set forth in claim 19, wherein said depositing includes depositing said substance on a surface of a semiconductor wafer.

26. The method as set forth in claim 19, further including rotating said substrate about an axis normal to said surface of said substrate.

27. The method as set forth in claim 19, further including maintaining said surface of said substrate in a vertical orientation during said depositing of said substance thereon.

28. The method as set forth in claim 19, wherein said substance is selected from the group consisting of metals, non-metals and metal alloys.

29. The method as set forth in claim 19, wherein said neutral atoms or molecules are created from positively charged ions from said portion of said gaseous phase.

30. The method as set forth in claim 19, further including providing a magnetic field during said creating to increase the flux of said neutral atoms or molecules.

31. The method as set forth in claim 19, wherein said neutral atoms or molecules are reflected at an angle of from about 60° to 90 degrees to the surface of said substrate.

* * * * *

UNITED STATES PATENT AND TRADEMARK OFFICE
CERTIFICATE OF CORRECTION

PATENT NO. : 5,114,556

DATED : May 19, 1992

INVENTOR(S) : Lawrence T. Lamont, Jr.

It is certified that error appears in the above-identified patent and that said Letters Patent is hereby corrected as shown below:

Column 2, Line 11, "steps Problems"should read --steps. Problems--.
Column 2, Line 16, "layer These" should read --layer. These--.
Column 3, Line 15, "necessary Stated" should read --necessary. Stated--.
Column 3, Line 16/17, "resputtering Thus" should read --resputtering. Thus--.
Column 6, Line 37, "11.8" should read --118--.
Column 6, Line 67, "128 Front" should read --128. Front--.
Column 10, Line 56, "118'" should read --118"--.
Column 14, Line 23, "said" (2nd occurrence) should read --and--.
Column 15, Line 4, "60°" should read --60--.
Column 15, Line 15, "60° to 90°" should read --60 to 90--.
Column 16, Line 9, "said being" should read --said controlling of the creating of said neutral atoms or molecules being--.
Column 16, Line 51, "60°" should read --60--.

Signed and Sealed this

Sixth Day of July, 1993

Attest:

MICHAEL K. KIRK

Attesting Officer

Acting Commissioner of Patents and Trademarks